United States Patent
Lu et al.

(10) Patent No.: US 12,234,179 B2
(45) Date of Patent: Feb. 25, 2025

(54) HIGH-DEFINITION FLICKER-FREE ETCHED GLASS, MANUFACTURING PROCESS THEREFOR, AND APPLICATION THEREOF

(71) Applicant: Opton (Shunchang) Optics Co., Ltd, Fujian (CN)

(72) Inventors: Zhang Lu, Fujian (CN); Zongcai Qiu, Fujian (CN); Jicai Zu, Fujian (CN)

(*) Notice: Subject to any disclaimer, the term of this patent is extended or adjusted under 35 U.S.C. 154(b) by 1037 days.

(21) Appl. No.: 16/982,545

(22) PCT Filed: Apr. 28, 2019

(86) PCT No.: PCT/CN2019/084821
§ 371 (c)(1),
(2) Date: Sep. 19, 2020

(87) PCT Pub. No.: WO2020/124925
PCT Pub. Date: Jun. 25, 2020

(65) Prior Publication Data
US 2021/0002166 A1    Jan. 7, 2021

(30) Foreign Application Priority Data
Dec. 18, 2018 (CN) .......................... 201811550749.8

(51) Int. Cl.
| | |
|---|---|
| *C03C 19/00* | (2006.01) |
| *C03C 15/00* | (2006.01) |
| *G02B 1/14* | (2015.01) |
| *G02B 3/00* | (2006.01) |
| *H01L 31/048* | (2014.01) |

(52) U.S. Cl.
CPC .............. *C03C 19/00* (2013.01); *C03C 15/00* (2013.01); *G02B 1/14* (2015.01); *G02B 3/0043* (2013.01); *H01L 31/048* (2013.01); *G02B 2207/101* (2013.01)

(58) Field of Classification Search
CPC ...................................................... C03C 19/00
See application file for complete search history.

(56) References Cited

U.S. PATENT DOCUMENTS 9,793,426 B2 * 10/2017 Mase ...................... C03C 15/00

* cited by examiner

*Primary Examiner* — William P Watkins, III

(57) ABSTRACT

A high-definition flicker-free etched glass, having a glossiness of 110-145, a haze of 3-10, and a definition of 90%-99.5%. The front surface of the glass is an irregular concave-convex lens surface having an average roughness of 0.025 µm-0.050 µm and provided with dents and bumps; the average chord length of the dents is 1.8 µm-10.0 µm; the average depth from the bottom of the dent to the top of the bump is 0.2 µm-0.7 µm; the average chord length of the bumps is 0.1 µm-0.5 µm; when a 250 µm*250 µm area on the front surface of the glass is observed after being amplified 500 times, there are 800-2500 irregular bumps, and the irregular bumps form an array of micro-convex lenses. By means of a sandblasting etching process, the spherical radius of each bump on the front surface of the etched glass is reduced and the focal length of each micro-convex lens is shortened, so that the focal point of light is closer to the surface of the glass, brightness of a high-pixel display device is brighter and more uniform, and it is not prone to see flicker of the focus point by the naked eye any more.

6 Claims, 3 Drawing Sheets

HIGH-DEFINITION FLICKER-FREE ETCHED GLASS, MANUFACTURING PROCESS THEREFOR, AND APPLICATION THEREOF

BACKGROUND OF THE INVENTION

The present invention relates to the technical field of display devices, and more specifically relates to a high-definition flicker-free etched glass, manufacturing process therefor, and application thereof.

Conventional anti-glare (AG) glass is used to solve the problem of light reflection of light rays external to a display device on a surface of the glass. As long as continuous and uneven pits each having a depth of 2 µm to 10 µm are made on the glass, interference caused by external light rays can be basically eliminated. CN107074626 disclosed an anti-glare glass sheet article for display device, wherein the article has a roughened surface that includes a surface with continuous irregularities having an arithmetic average roughness (Ra) of 0.01 to 0.1 µm, and an average interval (RSm) of 1 to 20 µm; depressions are dispersed over the surface each having a circular entrance portion measuring 3 to 20 µm in diameter, and a depth of 0.2 to 1.5 µm from the entrance portion; the roughened surface has 60 to 600 of the depressions in an observed 250 µm×250 µm region. In order to achieve the roughened effect of the glass, the disclosed Chinese patent document further teaches in paragraph 45 of the specification that a blasting material with a grain size #6000 to #8000 often leads to inefficient sandblasting because of the small grain diameter, therefore the blasting material has a grain size of preferably #1000 to #4000 (i.e. 11.9~3.1 µm), more preferably #1200 to #3000. However, as the resolution of a display screen has been developing from 2K to the currently popular resolution of 4K, and some display screens now even provide a resolution of 8K, pixels of the display screen are getting more dense, and the RGB pixels are getting closer and closer to one another, therefore, the use of etched glass prepared by sandblasting using blasting material of ordinary grain size as the glass surface of a display screen causes the problem of flickers. These flickers in the form of snowing effect are very harmful to the visual ability of human eyes because the flickers will produce dazzling effect which prevents clear visual reception of a displayed image at a glance, resulting in misreading and misjudgment, and this problem is particularly fatal during travel in a high-speed vehicle, airplane or spacecraft. Since high resolution displays of 4K or 8K displaying high pixel images are now widely used in portable displays and vehicle on-board displays, these displays without any change in size are now using higher resolution display screens, therefore a convex focus flash point of the light guide of the glass is brighter and the flickers are more intensely, thus the harm is more serious. On the other hand, an end product requires over 93% transmittance for the glass cover, which is usually solved by coating a layer of anti-reflective (AR) high-transmittance film on the glass surface. However, this solution on one hand greatly increases the cost of the product, and on the other hand affects the resolution of pixel light because of light refraction caused by difference in medium between the coating material and the glass material. Moreover, the use of AR coated product under harsh environmental conditions, such as when it is used outdoor, will result in yellowing and peeling of the coated layer. AG float glass generally has a transmittance of 88% to 91%, and the transmittance of Gorilla® Glass is higher, which is 93% to 94%. However, after the glass is etched by AG procedures, cloudiness of the sand blasted glass surface cannot be removed by conventional technique, and so transmittance of the etched glass will always be lower than that of the original glass. In view of this, the market of high-end display screens is desperately in need of a new kind of etched glass product that can eliminate flickers in high-pixel displays and at the same time retain anti-glare function, and such product should have high definition, high transmittance, no cloudiness, and good smoothness for touch control.

BRIEF SUMMARY OF THE INVENTION

A first object of the present invention is to provide a high-definition flicker-free etched glass.

The solution to achieve the first object of the present invention is detailed below: A high-definition flicker-free etched glass, having a glossiness of 110-145, haziness of 3-10, and distinctness of image of 90%-99.5%; a front surface of the etched glass is a glass surface with irregular unevenness having depressions and projections; said front surface of the etched glass has an average roughness of 0.025 µm-0.050 µm; an average chord length of the depressions is 1.8 µm-10.0 µm, an average depth from a bottom point of each depression to a top point of an adjacent projection is 0.2 µm-0.7 µm; an average chord length of the projections is 0.1 µm~0.5 µm; said front surface of the etched glass, when observed under 500× enlargement, has 800 to 2500 of the projections irregularly configured within a 250 µm×250 µm region; the irregularly configured projections constitute an array of microconvex lenses.

Researches conducted by the Applicant of the present invention showed that a large number of irregularly configured depressions and projections are formed on the surface of an etched glass after sandblasting. The irregularly configured depressions on the glass surface constitute an array of plano-concave lenses of different sizes, while the irregularly configured projections constitute an array of microconvex lenses of different sizes. Because a thin convex lens has light converging effect, when parallel lights from the densely arranged pixel dots penetrate the etched glass and enters the upper glass surface, the lights will enter each of the projections (i.e. the microconvex lenses) and concentrate on a point of each of the projections along their respective axes, and this point is the focal point of the respective microconvex lens. The bigger a projection on the uneven surface of the etched glass is, the stronger the light converging effect of the corresponding microconvex lens will become after vitrification, and the brighter the flashes will become at the focal point. If the diameter of the projection is too large, the focal length will be lengthened, and hence the focal point will exceed the glass surface, resulting in a very bright flicker which can be perceived by naked eyes, and when there are many big projections in an array, coupled with the factor of AC hertz frequency variations, flickering effect characterized by obvious snowing effect will appear on the display screen.

In a conventional etched glass, in order to reflect external lights to achieve anti-glaring effect, there are usually only 60-650 depressions on the glass surface within an area of 250 µm×250 µm under magnified observation. Each depression has a longer chord length and is also deeper. Likewise, each projection has longer chord length and a greater height. Therefore, the microconvex lenses in the prior art has great light converging effect for the pixel dots. Based on the technology of etched glass which is now used in existing displays, the present invention provides denser, ultra-fine and irregularly configured shallow depressions and short projections processed on an anti-glaring glass surface, and the irregularly configured short projections constitute an array of microconvex lenses. As such, the present invention weakens the light converging effect of big projections in conventional AG etched glass, and when the etched glass of the present invention is used as a front panel or a front cover of a display, a distance between a pixel light source and a corresponding projection on the glass surface is shortened, such that the focal point of the microcovex lens is closer to the glass surface. Also, as more microconvex lenses can be arranged, an HD display device can show brighter images in more uniform brightness. After weakening and minimizing the light converging point, flickers are no longer able to be observed by naked eyes when watching the display screen. In addition, the uneven glass surface, while having an anti-glaring effect, is also highly vitrified and transparent, with a transmittance rate as high as 93-95% and a distinctness of image as high as 90%-99.5%.

A second object of the present invention is to provide a high-definition anti-glare and flicker-free display screen, which comprises a front panel. Said front panel is the high-definition flicker-free etched glass described according to the first object of the invention.

A third object of the present invention is to provide a high-definition anti-glare and flicker-free display screen, which comprises a front panel. A front side of said front cover is mounted with a front cover. Said front cover is the high-definition flicker-free etched glass described according to the first object of the invention.

The display screen realized by the second and third objects of the present invention is installed with an etched glass that prevents light flickers caused by dense pixels, and this reduces the converging effect of lights at the microconvex lenses when the internal pixel lights pass through the etched glass, which in turns prevents flickers characterized as snowing effect. While ensuring the anti-glare effect of the glass surface, the present invention also diminishes reflection of a user's face as the user comes close to the display screen, therefore, the clarity of an UHD image is even more distinct, thus improving the high-resolution display effect of the high-definition display.

A fourth object of the present invention is to provide a solar cell module, which comprises a cover plate. Said cover plate is the high-definition flicker-free etched glass described according to the first object of the invention, and the distinctness of image is 95%-99.5% and the transmittance is 92%-95% for said etched glass. Since the etched glass according to the first object of the invention is used as the cover plate of the solar cell module, the cover plate can have an ultra-low solar reflectance and an ultra-high solar transmittance, thereby improving the light utilization of the solar cell module.

A fifth object of the present invention is to provide an anti-glare treatment process for the high-definition flicker-free etched glass described according to the first object of the invention; said anti-glare treatment process comprises the following steps:

1) Covering parts of a to-be-processed glass surface of a glass which are not required to be processed into an irregular array of microconvex lenses by an acid resistant and impact resistant protective layer;
2) Sandblasting process: mixing sand grains each having a chord length of 0.5-2 μm and water sufficiently to form micro-nano particles, moving a high-pressure water sand spray gun evenly over the glass surface to spray the micro-nano particles evenly to parts of the glass surface that are not covered with the acid resistant and impact resistant protective layer; wherein a pressure of the high-pressure water sand spray gun is 0.1-0.3 MPa, and a distance from a nozzle of the high-pressure water sand spray gun to the glass surface is 30-180 mm;
3) Etching process: placing the sand-blasted glass into etching solution for 30 s-120 s;
4) Cleaning process: placing the etched glass into a cleaning tank for cleaning, removing the acid resistant and impact resistant protective layer, and then cleaning the etched glass again.

Further, the anti-glare treatment process also comprises step 5) polishing process: polishing the cleaned glass obtained in step 4, after polishing, quickly placing the polished glass into the cleaning tank for cleaning.

Further, the polishing process in step 5 uses a wool felt polishing wheel as a polishing tool.

Conventional AG processing technology mainly uses dry spraying or wet method processing. The particle size of sand that can efficiently process the glass surface is 11.9 μm-3.1 μm. Since the processing material has a large particle size, the size of the resulting depressions is large, and the corresponding projections become larger as well. When pixel lights are emitted from the back of the glass, the focal points of the pixel lights greatly exceed the surface of the display screen, and hence increase the magnitude of light convergence which in turns produces discomfortable flickers at the convex lenses where lights converge. Further, the roughness of glass surface according to prior art can only be processed to reach about ISO grade number N8, and such surface shape can only be characterized as a "semi-glossy surface". The anti-glare treatment process achieved by the fifth object of the present invention is a breakthrough of the prejudiced prior art. The anti-glare treatment process of the present invention sufficiently mixes 0.3-2 μm sand grains and water to form micro-nano particles, and uses the micro-nano particles to impact against an outer glass surface by inertial impact force generated through high air pressure applying to the outer glass surface consecutively. The present invention is a solution to dry sandblasting or wet method processing in conventional sandblasting technology where ultra-fine sand cannot be used for sandblasting. According to the present invention, the density, depth, and chord length of the resulting depressions and projections created by the impact force during sandblasting can be designed and adjusted corresponding to the size of the pixel dots of the display, so as to obtain smaller and denser irregularly configured projections, shorten the chord length of each projection on the etched glass, and then through a precise acid etching process with precise time control and adjustment, shorten the focal length of each projection and thus weaken the brightness of converged lights at the projections and shorten the focal lengths of the microconvex lenses such that the focal points are closer to the glass surface, and also because more microconvex lenses are provided, the brightness of the HD display device is greater and more uniform. After shrinking and weakening of the focal points, flickers at the focal points are not easy to be perceived by naked eyes, also, the anti-glare function of AG glass is still retained even when external lights or solar lights shine on this nearly transparent and uneven glass surface, which reduces reflection of user's face on the glass surface. As the above-mentioned interference with the display screen by internal and external lights is eliminated, 4K HD and 8K UHD images will become even clearer.

DETAILED DESCRIPTION OF THE INVENTION

The preferred embodiments of the present invention will be further described in detail below with reference to the drawings.

Embodiment 1

Figure 2:
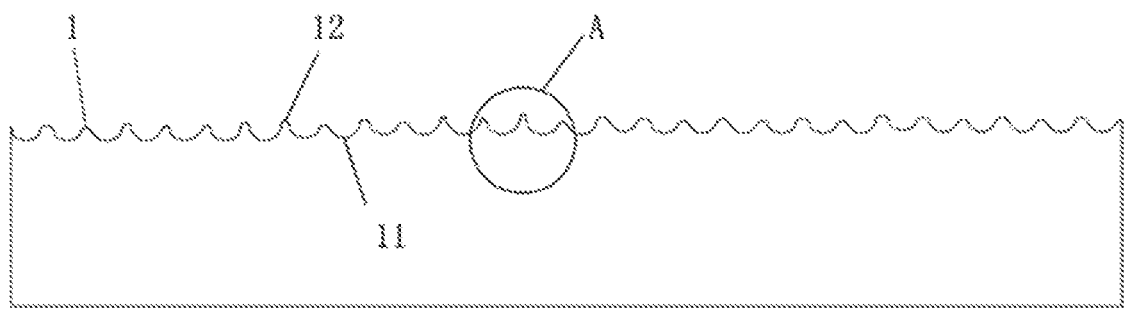
FIG. 2 is a structural view of the high-definition flicker-free etched glass according to embodiment 1 of the present invention.
Figure 3:
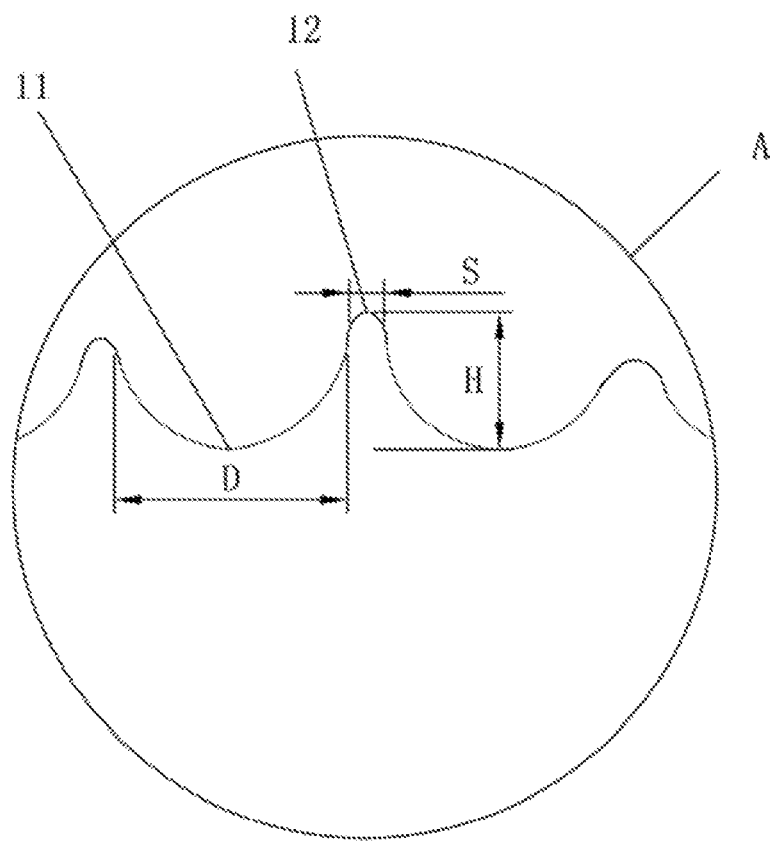
FIG. 3 is an enlarged view of portion A of FIG. 2.

As shown in FIGS. 2-3, A high-definition flicker-free etched glass, having a glossiness (Gs) of 110, haziness (Haze) of 10, and distinctness of image (DOI) of 90%; a front surface 1 of the etched glass is a glass surface with irregular unevenness having depressions 11 and projections 12; said front surface 1 of the etched glass has an average roughness (Ra) of 0.03 μm; an average chord length D of the depressions 11 is 10 μm, an average depth H from a bottom point of each depression 11 to a top point of an adjacent projection 12 is 0.7 μm; an average chord length S of the projections 12 is 0.5 μm; said front surface 1 of the etched glass, when observed under 500 times enlargement, has 820 projections irregularly configured within a 250 μm×250 μm region.

An anti-glare treatment process for the high-definition flicker-free etched glass of embodiment 1, comprising the following steps:
1) Covering parts of a to-be-processed glass surface of a glass which are not required to be processed into an irregular array of microconvex lenses by an acid resistant and impact resistant protective layer;
2) Sandblasting process: mixing sand grains each having a chord length of 2 μm and water sufficiently to form micro-nano particles, moving a high-pressure water sand spray gun evenly over the glass surface to spray the micro-nano particles evenly to parts of the glass surface that are not covered with the acid resistant and impact resistant protective layer; wherein a pressure of the high-pressure water sand spray gun is 0.3 MPa, and a distance from a nozzle of the high-pressure water sand spray gun to the glass surface is 180 mm;
3) Etching process: placing the sand-blasted glass obtained in step 2 into etching solution for 120 s;
4) Cleaning process: placing the etched glass obtained in step 3 into a cleaning tank for cleaning, removing the acid resistant and impact resistant protective layer, and then cleaning the etched glass again;
5) Polishing process: polishing the cleaned glass obtained in step 4 by a wool felt polishing wheel, after polishing, placing the polished glass into the cleaning tank for cleaning.

Embodiment 2-5

Different parameters in the anti-glare treatment process are used in embodiments 2-5 compared with embodiment 1. The different parameters as well as the technical data of the respective etched glasses obtained are shown in table 1 below.

Comparative Embodiments 1-3

Comparative embodiments 1-3 are the parameters in the anti-glare treatment process according to prior arts and the technical data of the etched glasses obtained according to prior arts.

TABLE 1

| Item | Embodiment 1 | Embodiment 2 | Embodiment 3 | Embodiment 4 | Embodiment 5 | Comparative embodiment 1 | Comparative embodiment 2 | Comparative embodiment 3 |
|---|---|---|---|---|---|---|---|---|
| Sand grain diameter (μm) | 2 | 1.5 | 1.3 | 1 | 0.5 | 3.1 | 4.2 | 6.5 |
| Sandblast pressure (MPa) | 0.3 | 0.25 | 0.2 | 0.1 | 0.1 | 0.4 | 0.4 | 0.4 |
| Sandblast distance (mm) | 180 | 130 | 80 | 50 | 30 | 110 | 110 | 110 |
| Etching time (s) | 120 | 90 | 80 | 60 | 30 | 360 | 480 | 600 |
| Glossiness Gs | 110 | 120 | 130 | 140 | 145 | 50 | 50 | 53 |
| Haziness Haze | 10 | 8 | 6 | 5 | 3 | 12 | 9 | 11 |
| Distinctness Of Image DOI (%) | 90 | 93 | 96 | 99 | 99.5 | 79 | 64 | 55 |
| Average roughness Ra (μm) | 0.05 | 0.04 | 0.035 | 0.03 | 0.025 | 0.16 | 0.19 | 0.2 |
| Chord | 10 | 7 | 5 | 2 | 1.8 | 13 | 14 | 18 |

TABLE 1-continued

| Item | Embodiment 1 | Embodiment 2 | Embodiment 3 | Embodiment 4 | Embodiment 5 | Comparative embodiment 1 | Comparative embodiment 2 | Comparative embodiment 3 |
|---|---|---|---|---|---|---|---|---|
| length of depression (μm) | | | | | | | | |
| Average chord length of projections (μm) | 0.50 | 0.40 | 0.20 | 0.12 | 0.10 | 0.38 | 0.38 | 0.31 |
| Average depth (μm) | 0.7 | 0.6 | 0.5 | 0.3 | 0.2 | 1.2 | 1.4 | 1.7 |
| Projections (number) | 820 | 880 | 1950 | 2200 | 2500 | 210 | 162 | 141 |

Since human eyes are more sensitive to green lights, observation is carried out where HD display screens mounted with the etched glass of the present invention in embodiments 1-5 and the etched glass of the prior arts in comparative embodiments 1-3 are adjusted to green screens. Flickers are not observed for display screens using the etched glasses according to embodiments 1-5. However, obvious discomforting flickers are observed for display screens using the etched glasses according to comparative embodiments 1-3.

A conventional 55-inch 2K display screen has an outer dimension (unit: mm) of 1219(H)×726(V) and a pixel spacing (unit: mm) of 0.21(W)×0.63(H); a 86-inch 4K HD display screen has an outer dimension of 1913(H)×1804(V) and a pixel spacing of 0.493(W)×0.493(H); a 98-inch 8K display screen has 7680(H)×4320(V) number of pixels and a pixel spacing of 0.093(W)×0.028(H). In order to eliminate the undesired effects caused by the convex lenses on the HD anti-glare glass, and to eliminate the problem of flickers in the form of snowing effect, a glass surface of a 4K display screen should have 800-1200 projections corresponding to a pixel while a glass surface of a 8K display screen should have 1000-1500 projections corresponding to a pixel under observation of a 250 μm×250 μm region of the front glass surface enlarged by 500 times. In order to make the densely arranged depressions and projections, the present invention mixes 0.5-2 μm sand grains and water to form micro-nano particles, and uses the micro-nano particles to impact against an outer glass surface by inertial impact force generated through high air pressure applying to the outer glass surface consecutively. The present invention is a solution to dry sandblasting or wet method processing in conventional sandblasting technology where ultra-fine sand cannot be used for sandblasting. According to the present invention, the density, depth, and chord length of the resulting depressions and projections created by the impact force during sandblasting can be designed and adjusted corresponding to the size of the pixel dots of the display. By coordinating different parameters, an array of microconvex lenses formed by irregularly configured projections more densely arranged compared to the prior art can be obtained. Further, the etching process will also perform vitrification upon the cloudy sandblasted surface, therefore, the cloudiness of the uneven surface caused by sandblasting can be eliminated, while the diameters of the irregularly configured microconvex lenses arranged in an array can be maintained. Since the cloudiness and haziness of the glass surface are delicately eliminated, transmittance of the glass can be increased by 1-2%, and the distinctness of image can be increased up to 95% to 99.5%. Therefore, the pixels of the images are in higher resolution and in greater distinctness.

Embodiment 6

Figure 4:
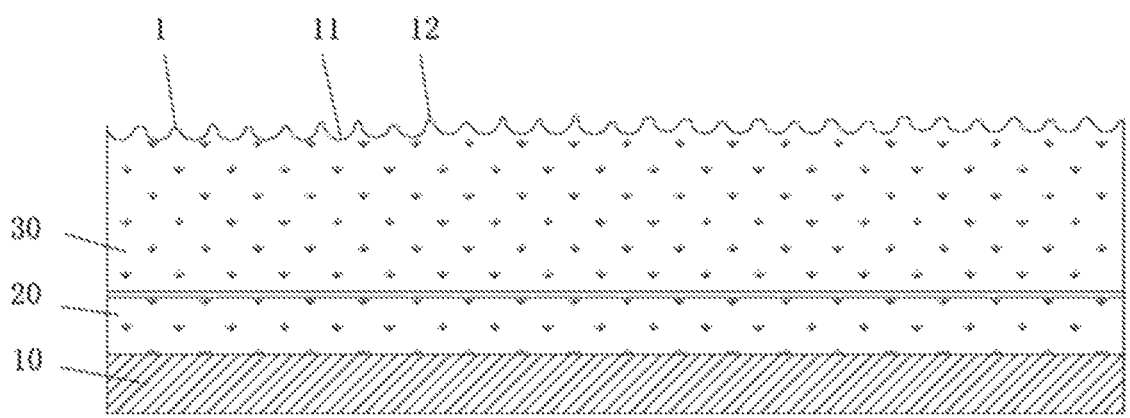
FIG. 4 is a structural view of the high-definition anti-glare and flicker-free display screen according to embodiment 6 of the present invention.

FIG. 4 shows a high-definition anti-glare and flicker-free display screen, comprising a front panel 20 and a pixel light source 10. A front surface of the of the front panel 20 is provided with the high-definition flicker-free etched glass 30 according to embodiment 1.

Figure 1:
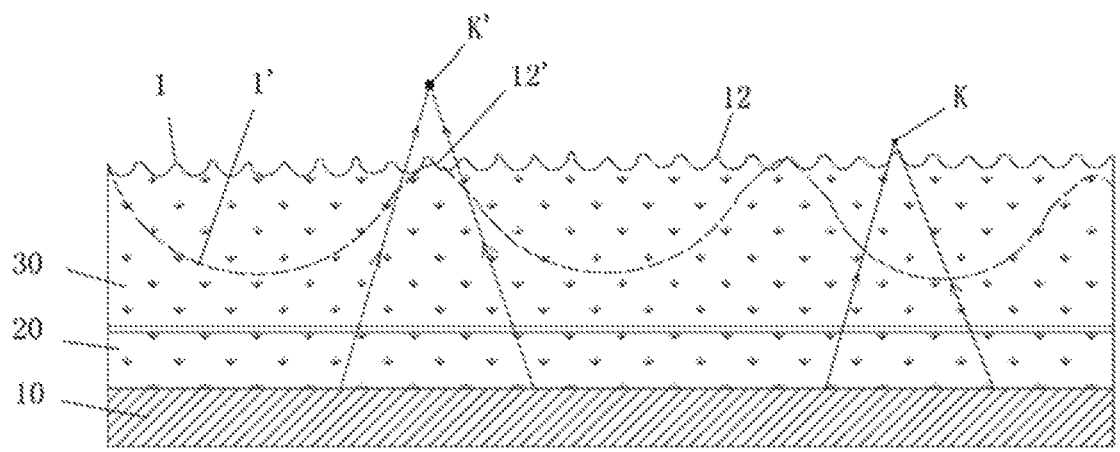
FIG. 1 is an optical concept diagram of the formation of flickers on a display screen, wherein broken wavy lines indicate a front side of a conventional etched glass, while solid wavy lines indicate a front side of a the high-definition flicker-free etched glass according to an embodiment of the present invention.

As shown in FIG. 1, the solid wavy lines represent a front surface 1 of the high-definition flicker-free etched glass of the present invention. Light rays emitted from a pixel light source 10 are converged at point K after passing through a corresponding projection 12 on the front surface 1. The broken way lines represent a front surface 1' of a conventional etched glass, where light rays emitted from a pixel light source 10 are converged at point K' after passing through a corresponding projection 12' on the front surface 1'. Since large sand grains of 3.1 μm-11.9 μm grain size are used for sandblasting in conventional etched glass, the projections 12' formed on the front surface 1' according to the prior art are larger than the projections 12 formed on the front surface 1 according to the present invention, and so the focal point K' according to the prior art is more distant from the front surface compared with the focal point K according to the present invention, thereby creating flickers in the form of snowing effect which is obviously irritating to human eyes. By contrast, the focal point K according to the present invention is closer to the front surface 1, and because the front surface is formed with more microcovex lenses compared with prior art, brightness of the HD display screen is therefore brighter and more uniform. After shrinking and weakening the point of convergence of the lights, the flickers at the point of convergence will not be easily observed by naked eyes.

Embodiment 7

Figure 5:
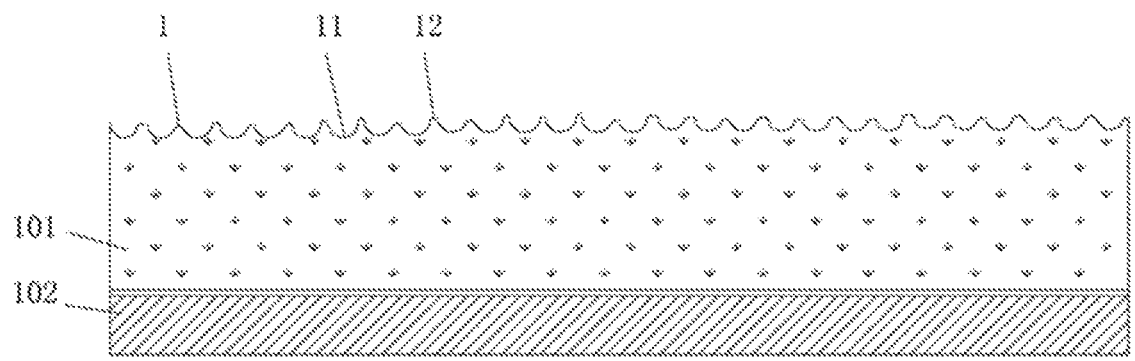
FIG. 5 is a structural view of the high-definition anti-glare and flicker-free display screen according to embodiment 7 of the present invention.

FIG. 5 shows a high-definition anti-glare and flicker-free display screen, comprising a front panel 101 and a pixel light source 102. The front panel 101 is the high-definition flicker-free etched glass according to embodiment 1.

Embodiment 8

Figure 6:
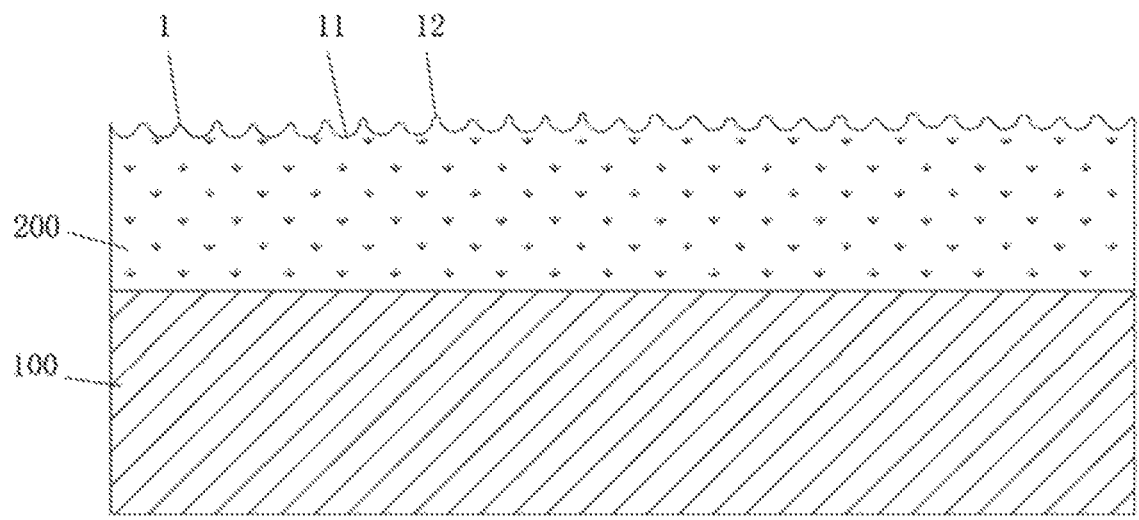
FIG. 6 is a structural view of the solar cell module according to embodiment 8 of the present invention.

FIG. 6 shows a solar battery module 100, comprising a cover plate 200. Said cover plate 200 is the high-definition flicker-free etched glass according to embodiment 3 having distinctness of image being 96% and transmittance being 95%.

In practical use, the etched glass being the cover plate of the solar battery module can have distinctness of image ranging 95%-99.5% and transmittance rangin 92%-95%.

The high-definition flicker-free etched glass used as the cover plate of the solar battery module has ultra-low solar light reflection rate but ultra-high solar light transmittance, thereby greatly increasing the power generation rate of the solar battery module.

The above description is only intended to describe the embodiments of the present invention but not to limit the scope of the present invention through the described embodiments. Any equivalent replacements made according to the description of the present invention or use of the present invention directly or indirectly in other related technical fields should also fall within the scope of protection of the present invention.

What is claimed is:

1. A high-definition flicker-free etched glass, having a glossiness of 110-145, haziness of 3-10, and distinctness of image of 90%-99.5%; a front surface of the etched glass is a glass surface with irregular unevenness having depressions and projections; said front surface of the etched glass has an average roughness of 0.025 μm-0.050 μm; an average chord length of the depressions is 1.8 μm-10.0 μm, an average depth from a bottom point of each depression to a top point of an adjacent projection is 0.2 μm-0.7 μm; an average chord length of the projections is 0.1 μm~0.5 μm; said front surface of the etched glass, when observed under 500 times enlargement, has 800 to 2500 of the projections irregularly configured within a 250 μm×250 μm region; the irregularly configured projections constitute an array of microconvex lenses.

2. A high-definition anti-glare and flicker-free display screen, comprising a front panel; a front side of said front panel is mounted with a front cover; said front cover is the high-definition flicker-free etched glass of claim 1.

3. A high-definition anti-glare and flicker-free display screen, comprising a front panel; said front panel is the high-definition flicker-free etched glass of claim 1.

4. An anti-glare treatment process for the high-definition flicker-free etched glass of claim 1, wherein said anti-glare treatment process comprises the following steps:
  1. Covering parts of a to-be-processed glass surface of a glass which are not required to be processed into an irregular array of microconvex lenses by an acid resistant and impact resistant protective layer;
  2. Sandblasting process: mixing sand grains each having a chord length of 0.5-1.5 μm and water sufficiently to form micro-nano particles, moving a high-pressure water sand spray gun evenly over the glass surface to spray the micro-nano particles evenly to parts of the glass surface that are not covered with the acid resistant and impact resistant protective layer;
  wherein a pressure of the high-pressure water sand spray gun is 0.1-0.3 MPa, and a distance from a nozzle of the high-pressure water sand spray gun to the glass surface is 30-180 mm;
  3. Etching process: placing the sand-blasted glass obtained in step 2 into etching solution for 30s-120s;
  4. cleaning process: placing the etched glass obtained in step 3 into a cleaning tank for cleaning, removing the acid resistant and impact resistant protective layer, and then cleaning the etched glass again.

5. The anti-glare treatment process of claim 4, also comprising step 5 polishing process: polishing the cleaned glass obtained in step 4, after polishing, placing the polished glass into the cleaning tank for cleaning.

6. The anti-glare treatment process of claim 5, wherein the polishing process in step 5 uses a wool felt polishing wheel as a polishing tool.

* * * * *